United States Patent
Lee et al.

(10) Patent No.: US 6,654,290 B2
(45) Date of Patent: Nov. 25, 2003

(54) FLASH MEMORY DEVICE WITH CELL CURRENT MEASURING SCHEME USING WRITE DRIVER

(75) Inventors: Seung-Keun Lee, Kyunggi-do (KR); Young-Ho Lim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/995,500

(22) Filed: Nov. 26, 2001

(65) Prior Publication Data

US 2002/0122334 A1 Sep. 5, 2002

(30) Foreign Application Priority Data

Jan. 3, 2001 (KR) ............................................. 2001-214

(51) Int. Cl.⁷ .............................................. G11C 16/06
(52) U.S. Cl. ............. 365/185.23; 365/201; 365/185.09; 365/185.11
(58) Field of Search ............................ 365/185.23, 200, 365/201, 185.11, 185.09

(56) References Cited

U.S. PATENT DOCUMENTS

| | | | | |
|---|---|---|---|---|
| 5,400,281 A | * | 3/1995 | Morigami | ................... 365/201 |
| 5,999,450 A | * | 12/1999 | Dallabora et al. | ...... 365/185.09 |
| 6,094,377 A | * | 7/2000 | Roohparvar et al. | ... 365/189.05 |

* cited by examiner

*Primary Examiner*—David Nelms
*Assistant Examiner*—Connie C. Yoha
(74) *Attorney, Agent, or Firm*—Marger Johnson & McCollom, P.C.

(57) ABSTRACT

A flash memory device includes a column selector, a voltage switch circuit, and a plurality of write drivers. The column selector selects one of bitlines of each group, and the voltage switch circuit selects a program voltage from a high voltage pump circuit or an external voltage from an external voltage pad. The write drivers are connected to input/output pads through corresponding data input buffers. For a test operation mode to measure a cell current, each of the write drivers transfers or cuts off a voltage, selected by the voltage switch circuit, to a selected bitline of a corresponding group in response to a data bit signal applied to a corresponding input/output pad. Thus, the write drivers are used to measure a cell current of a memory cell without extra path gates.

9 Claims, 7 Drawing Sheets

FLASH MEMORY DEVICE WITH CELL CURRENT MEASURING SCHEME USING WRITE DRIVER

This application relies for priority upon Korean Patent Application No. 2001-000214, filed on Jan. 3, 2001, the contents of which are herein incorporated by reference in their entirety.

FIELD OF THE INVENTION

The present invention generally relates to a flash memory device and, more particularly, to a flash memory device that can measure a flowing current through a memory cell.

BACKGROUND OF THE INVENTION

Typical construction of the cell (or cell transistor) of a flash memory device is shown in FIG. 1. Source 3 and drain 4, each being formed of a N+ diffused region in P+ semiconductor substrate (P-sub) 2, are separated from each other through a channel region that is defined in the substrate 2. Floating gate 6 is formed over the channel region through a thin insulating film 7. Another insulating film 9 on the floating gate 6 isolates the control gate 8 from the floating gate 6. The source 3, drain 4, control gate 8, and substrate 2 are each connected to their corresponding voltage sources Vs (source voltage), Vd (drain voltage), Vg (gate voltage), and Vb (bulk voltage), for programming, erasing, and reading operations.

Table 1 shows levels of voltages used in programming, erasing, and reading.

TABLE 1

| Operation Mode | Vg    | Vd       | Vs       | Vb  |
|----------------|-------|----------|----------|-----|
| Programming    | 9 V   | 5 V      | 0 V      | 0 V |
| Erasing        | −9 V  | Floating | Floating | 9 V |
| Reading        | 4.5 V | 1 V      | 0 V      | 0 V |

In programming, as is well known, a selected memory cell is programmed by means of hot electron injection between the channel region and floating gate, in which the source and substrate are held at a ground voltage, a high voltage (Vg=9V) is applied to the control gate, and a voltage suitable for inducing the hot electrons therein is applied to the drain. After programming, a threshold voltage of the selected memory cell is increased due to a deposition of electrons. In order to read data from the programmed cell, a voltage of about 1V is applied to the drain, a power source voltage (e.g., 4.5V) is applied to the control gate, and the source is held at the ground voltage. Since the increased threshold voltage of the programmed memory cell acts as blocking potential for a gate voltage during a read-out operation, the programmed cell is sensed as an "off-cell" by a sense amplifier circuit (not shown).

Erasing a memory cell is accomplished by a conducting F-N (Fowler-Nordheim) tunneling effect. To induce the F-N tunneling, the control gate is coupled to a high negative voltage of about −9V and the substrate is coupled to a positive voltage of about 9V. In this case, the drain is conditioned at a high-impedance state (or a floating state). A strong electric field induced by such voltage bias conditions, between the control gate and the substrate, causes electrons to be moved into the source. The erased cell has a lower threshold voltage than before, and is sensed as an "on-cell" by the sense amplifier circuit.

The threshold voltage of a programmed/erased memory cell can be measured (or determined) by measuring an amount of a current that flows through a memory cell when applying the voltages Vd and Vg corresponding to the drain and gate of the cell transistor. A conventional flash memory is shown in FIG. 2.

Referring now to FIG. 2, a NOR-type flash memory device includes memory cell array as data storage area. The memory cell array is made of a plurality of array blocks 10a, 10b, . . . , and 10c determined with input/output structure (or each corresponding to input/output pads). Each of the array blocks 10a, 10b, . . . , and 10c has a plurality of memory cells that are arranged in a matrix of rows (or wordlines) WL0–WLm and columns (or bitlines). Each of the memory cells is connected between a corresponding bitline and source line S/L, and is driven by a potential of a corresponding wordline connected to a row decoder 12. In other words, memory cells of each row are coupled to a corresponding bitline.

The row decoder 12 selects one of the wordlines WL0–WLm that are arranged through each of the array blocks 10a, 10b, . . . , and 10c. The row decoder 12 supplies the selected wordline to a wordline voltage VWL that is received from one of a high voltage charge pump 16, a read pump 18, and an external voltage pad 20 through a wordline voltage selector circuit 14. The high voltage charge pump 16 generates a wordline voltage required in a programming operation, and the read pump 18 generates a wordline voltage required in a reading operation. In a test operation mode to measure a current flowing through a memory cell (hereinafter referred to as "cell current"), an external voltage is applied through the external voltage pad 20.

The NOR-type flash memory device includes column selectors 24a, 24b, . . . , and 24c each corresponding to array blocks 10a, 10b, . . . , and 10c that are coupled to corresponding data lines DLa, DLb, . . . , and DLc, respectively. For simplicity, a typical construction associated with only one column selector will be explained herein. However, it is understood that constructions associated with the other columns will be identical thereto. The column selector 24a selects one column of the corresponding array block 10a, and connects the selected column to the corresponding data line DLa. A sense amplifier 28a, a write driver 30a, and a path gate 38a are commonly connected to the data line DLa.

For a reading operation, the sense amplifier 28a senses and amplifies data of the memory cell through the selected column by the corresponding column selector 24a, and transmits the sensed data to a corresponding input/output pad 36a through a corresponding data output buffer 32a. For a programming operation, the write driver 30a transfers write (or program) data, supplied from the corresponding input/output pad 36a, to the selected column through the corresponding data input buffer 34a. High level write data at a high voltage Vpb is supplied from the high voltage charge pump 26 and generates a drain voltage (or bitline voltage) required in the programming operation. The path gate 38a is made of an NMOS transistor connected between a corresponding data line and an input/output pad, as shown in FIG. 3. The NMOS transistor is switched in accordance with a control signal CurMeas that indicates a test operation mode to measure a cell current.

In the test operation mode, any wordline is selected by the row decoder 12, and one bitline of the respective array blocks 10a, 10b, . . . , and 10c is selected by the column decoder 22 and the corresponding column selector. An external voltage, which is supplied through the external voltage pad 20, is supplied to the selected wordline. Data bits, each being transferred to corresponding input/output pads, are transferred to the selected bitline of the array blocks 10a, 10b, ..., and 10c through the corresponding path gates 38a, 38b, ..., and 38c and the data lines DLa, DLb, ..., and DLc. Under such a condition, the current flowing through a memory cell to be tested at each array block is externally measured.

In the conventional flash memory device, path gates must be constructed corresponding to the number of sense amplifiers or write drivers. This causes an undesirable increase in a chip size of the flash memory device.

SUMMARY OF THE INVENTION

It is an object of the present invention to provide a flash memory device capable of measuring a cell current with the use of a write drive.

According to one aspect of the invention, a non-volatile semiconductor memory device includes an array of memory cells that are arranged in a matrix of bitlines and wordlines. The bitlines are divided into a plurality of groups each corresponding to input/output pads. The non-volatile semiconductor memory device further includes a column selection circuit, a first voltage switch circuit, and a plurality of write drivers. The column selection circuit selects one of the bitlines of the respective groups. The first voltage switch circuit selects a first program voltage from a high voltage pump circuit or a first external voltage from an external voltage pad. The write drivers are connected to input/output pads through corresponding data input buffers, respectively.

For a test operation mode to measure a cell current, each of the write drivers transfers or cuts off a voltage selected by the first voltage switch circuit to a selected bitline of a corresponding group in response to a data bit signal that is applied to a corresponding input/output pad.

The non-volatile semiconductor memory device further includes a row decoder for selecting one of the wordlines and supplying a wordline voltage to the selected wordline, and a second switch circuit for selecting a read-out voltage or a second external voltage and transferring the selected voltage to the row decoder as the wordline voltage. When the voltage selected by the first voltage switch circuit is transferred to the selected bitline of the corresponding group, the cell current is measured through a measure pad to which the second external voltage is applied. If a value of a data bit applied to a corresponding input/output pad is "0", each of the write drivers transfers the voltage selected by the first voltage switch circuit to a selected bitline of a corresponding group. If the value is "1", each of the write drivers cuts off the selected voltage.

According to another aspect of the invention, there is provided a method of measuring a cell current of a non-volatile semiconductor memory device including a plurality of bitlines, a plurality of wordlines, and an array of memory cells located at intersections of the bitlines and the wordlines. The bitlines are classified into groups each corresponding to input/output pads. One of the wordlines and one of the bitlines of the respective groups are selected. After a first external voltage as a wordline voltage is applied to the selected wordline, a data bit signal of a first voltage level is applied to one of the input/output pads. A data bit signal of a second voltage level is applied to the others.

For a test operation mode to measure a cell current, a second external voltage as a bitline voltage is applied to the selected bitline through a write driver corresponding to a data bit signal of a second external voltage. In addition, the second external voltage is separated from the write drivers each corresponding to input/output pads to which the data bit signal of the second voltage level is applied. And, a cell current of a memory cell corresponding to the first voltage level is measured through a measure pad to which the second external voltage is applied.

DESCRIPTION OF THE PREFERRED EMBODIMENT

Figure 1:
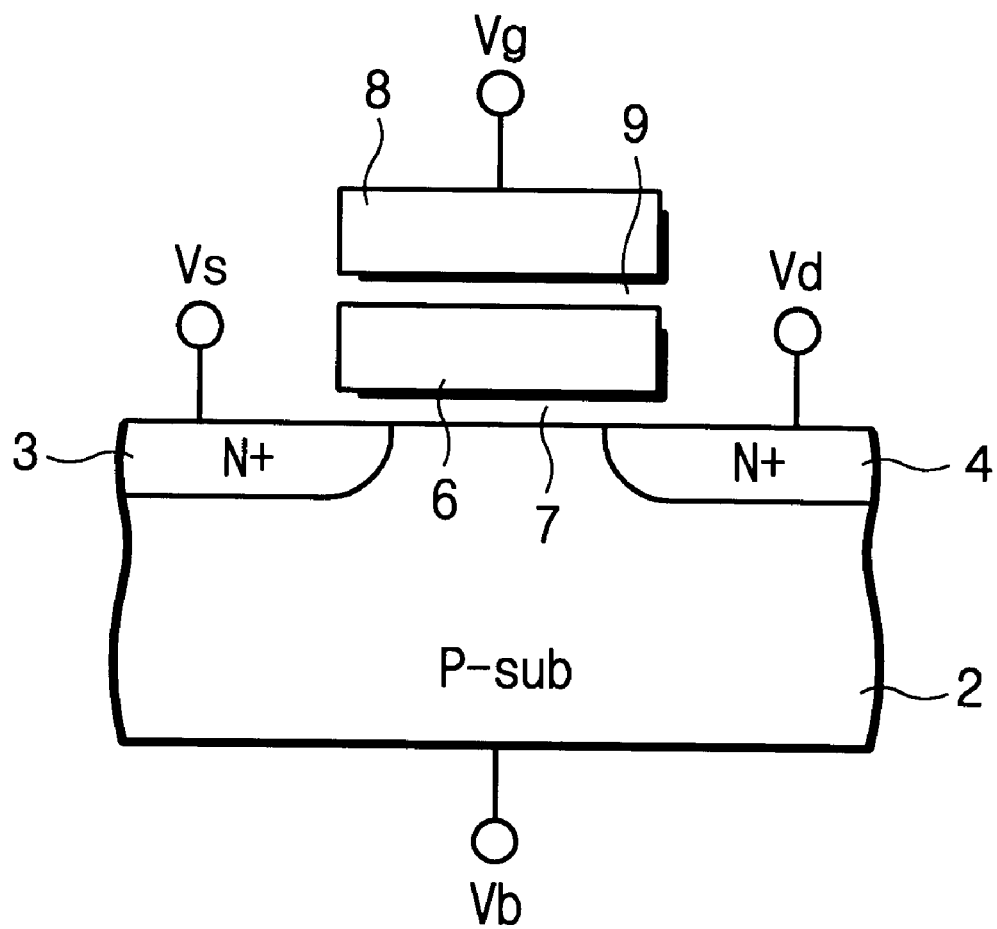
FIG. 1 is a cross-sectional view showing a construction of a typical flash memory cell.
Figure 2:
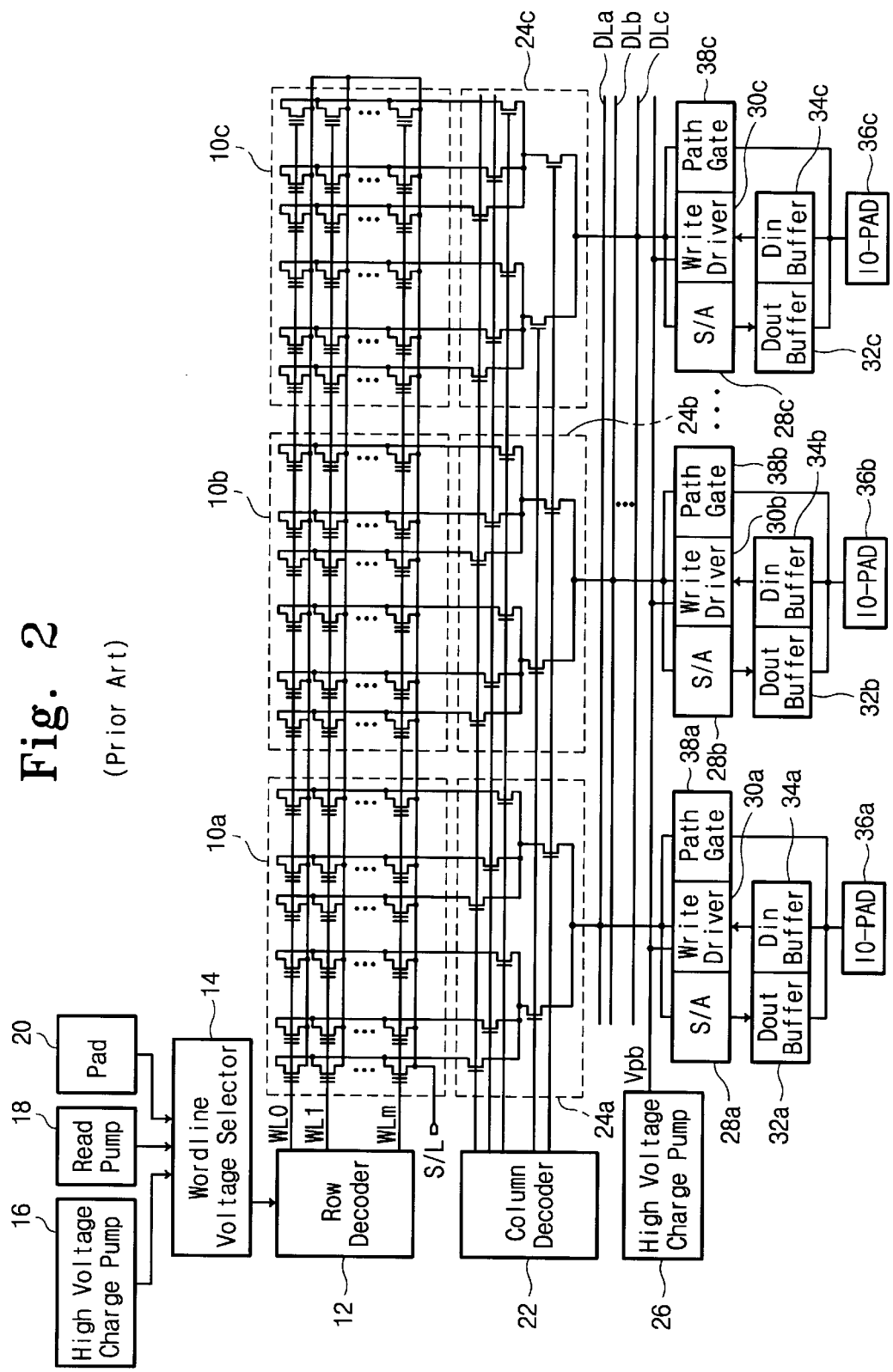
FIG. 2 is a block diagram showing a flash memory device according to the prior art.
Figure 3:
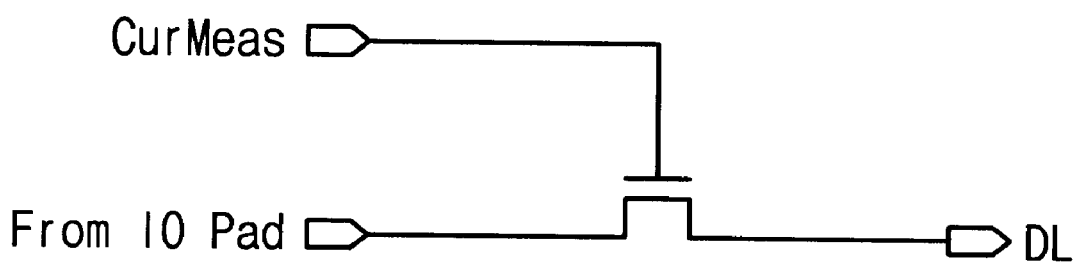
FIG. 3 is a circuit diagram showing a path gate illustrated in FIG. 2.
Figure 4:
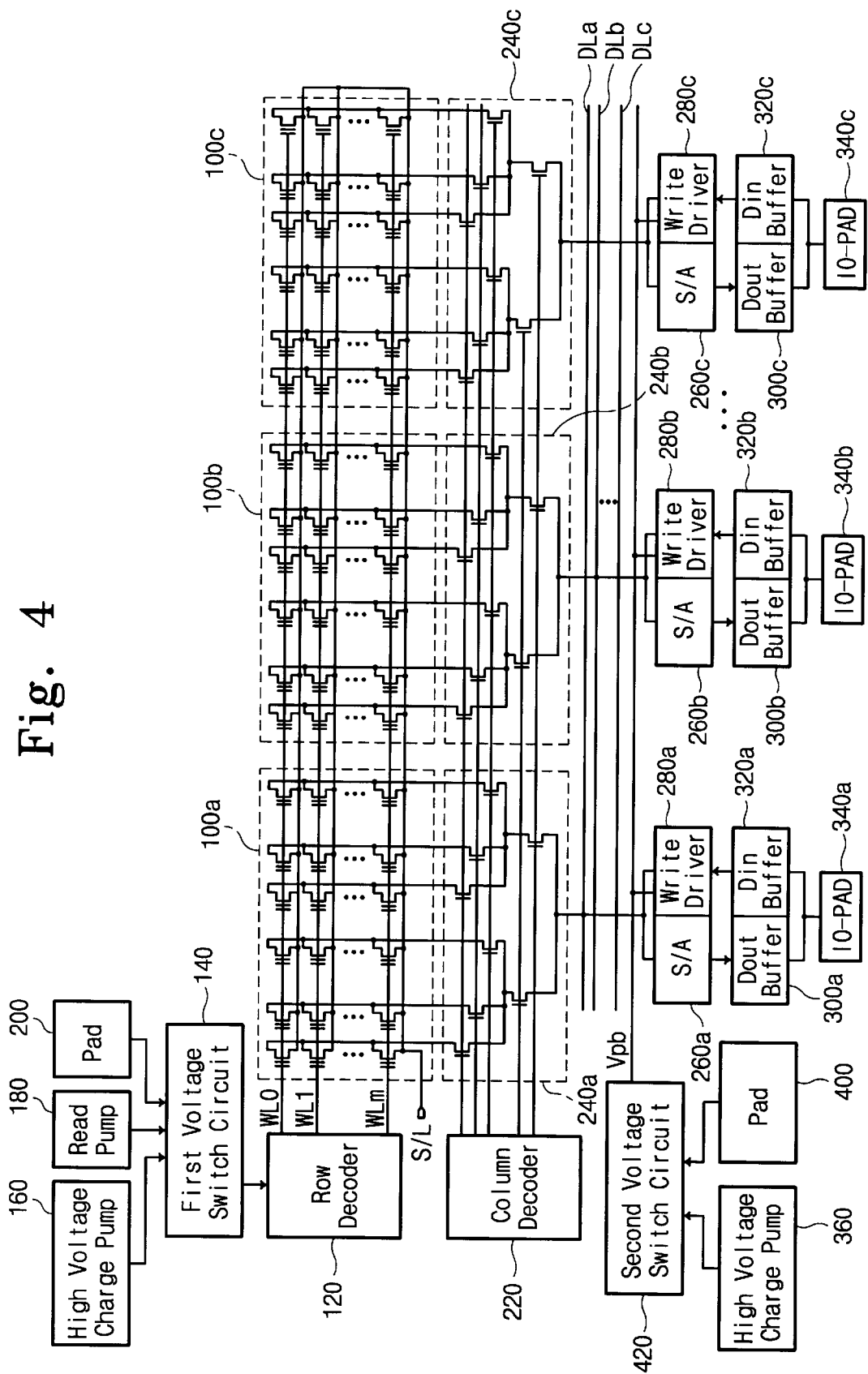
FIG. 4 is a block diagram showing a flash memory device according to the present invention.

FIG. 4 schematically illustrates a NOR-type flash memory device according to a preferred embodiment of the present invention. The NOR-type flash memory device includes a memory cell array as a data storing area, which is made of a plurality of array blocks 100a, 100b, ..., and 100c each corresponding to input/output pads 340a, 340b, ..., and 340c. Each of the array blocks 100a, 100b, ..., and 100c includes a plurality of memory cells that are arranged in a matrix of wordlines WL0–WLm and bitlines. Each of the memory cells is connected between a corresponding bitline and a source line S/L, and is driven with a potential of a corresponding wordline coupled to a row decoder 120.

The row decoder 120 selects one of the wordlines WL0–WLm through each of the array blocks 100a, 100b, ..., and 100c, and supplies a wordline voltage VWL to the selected wordline. The wordline voltage VWL is supplied from one of a high voltage charge pump 160, a read pump 180, and a first external voltage pad 200 through a first voltage switch circuit 140. The high voltage charge pump 160 generates a wordline voltage that is necessary for programming. The read pump 180 generates a wordline voltage that is necessary for reading. In a test operation mode to measure a cell current, an external voltage is applied through a first external voltage pad 200.

Figure 5:
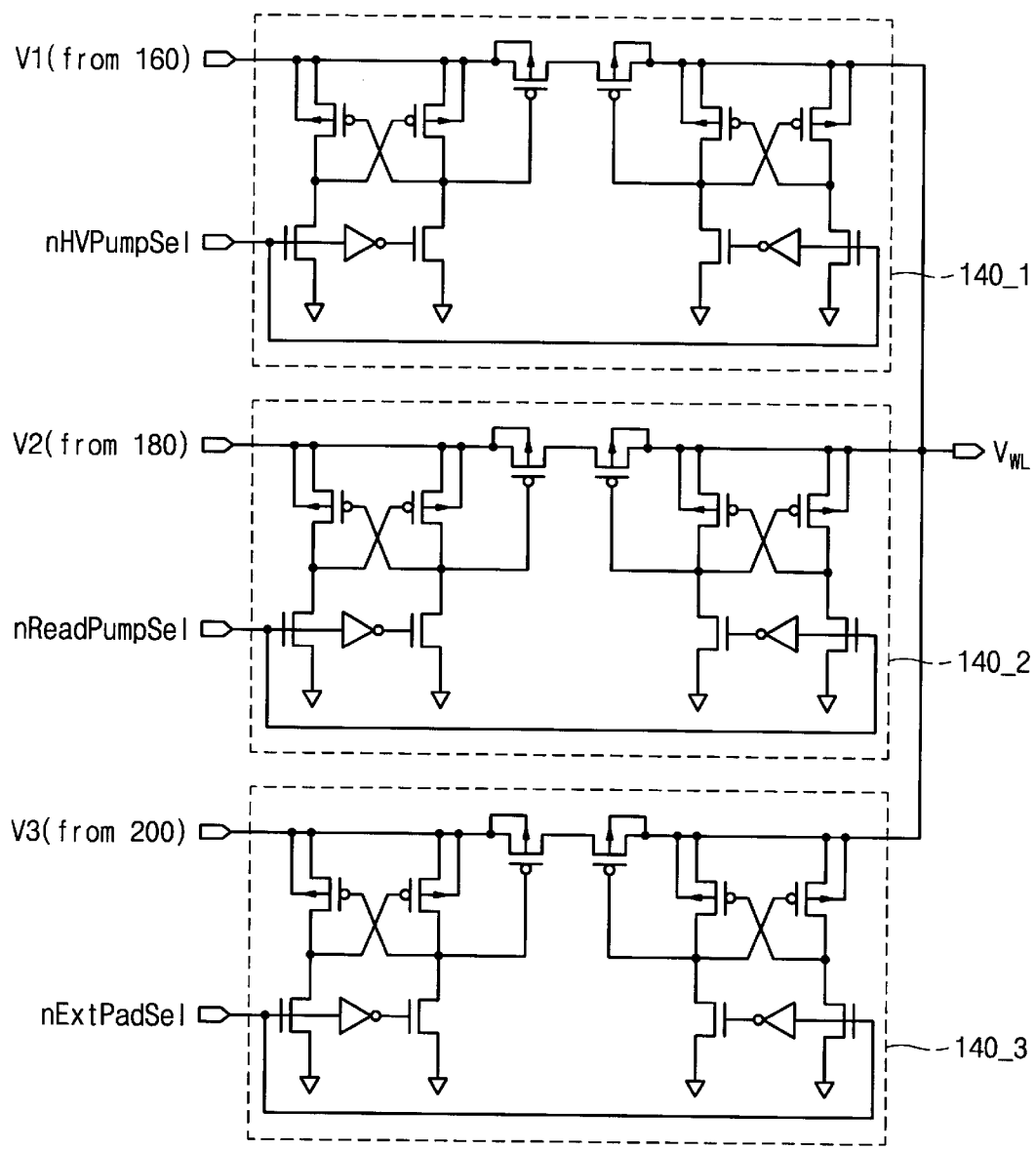
FIG. 5 is a circuit diagram showing a preferred embodiment of a first voltage switch circuit illustrated in FIG. 4.

FIG. 5 illustrates a preferred embodiment of the first voltage switch circuit 140. The first switch circuit 140 is made of first to third selection units 140_1, 140_2, and 140_3 that are commonly connected to an output terminal VWL. Each of the selection units 140_1, 140_2, and 140_3 has the same construction. The first selection unit 140_1 transfers a voltage V1, generated from a high voltage charge pump 160, to the output terminal VWL in response to a select signal nHVPumpSel of low level. Also, the first selection unit 140_1 electrically isolates the read pump 180 from the output terminal VWL in response to a select signal nHVPumpSel of high level. The second selection unit 140_2 transfers a voltage V2, generated from a read pump 180, to the output terminal VWL in response to a select signal nReadPumpSel of low level. Also, the second selection unit 140_2 electrically isolates the read pump 180 from the output terminal VWL in response to a select signal nReadPumpSel of high level. The third selection unit 140_3 transfers a voltage, generated from a first external voltage pad 200, to the output terminal VWL in response to a select signal nExtPadSel of low level. Also, the third selection unit 140_3 electrically isolates the first external voltage pad 200 from the output terminal VWL in response to a select signal nExtPadSel of high level.

Returning to FIG. 4, the NOR-type flash memory device includes column selectors 240a, 240b, ..., and 240c each corresponding to the array blocks 100a, 100b, ..., and 100c that are coupled to corresponding data lines DLa, DLb, ..., and DLc, respectively. For simplicity, a typical construction associated with only one column selector will be explained herein. However, it is understood that constructions associated with the other columns will be identical thereto. The column selector 240a selects one column of the corresponding array block 100a, and connects the selected column to the corresponding data line DLa. A sense amplifier 260a and a write driver 280a are commonly connected to the data line DLa.

In reading, the sense amplifier 260a senses and amplifies data of a memory cell through a column selected by a corresponding selector 240a, and transfers the sensed data to the input/output pad 340a through a corresponding data output (Dout) buffer 300a. In programming, the write driver 280a transfers write data, supplied from the corresponding input/output pad 340a, to the selected column through a corresponding data input (Din) buffer 320a. Write drivers 280a, 280b, ..., and 280c corresponding to the input/output pads 340a, 340b, ..., and 340c are coupled to commonly receive a voltage Vpb generated by a second voltage switch circuit 420.

Figure 6:
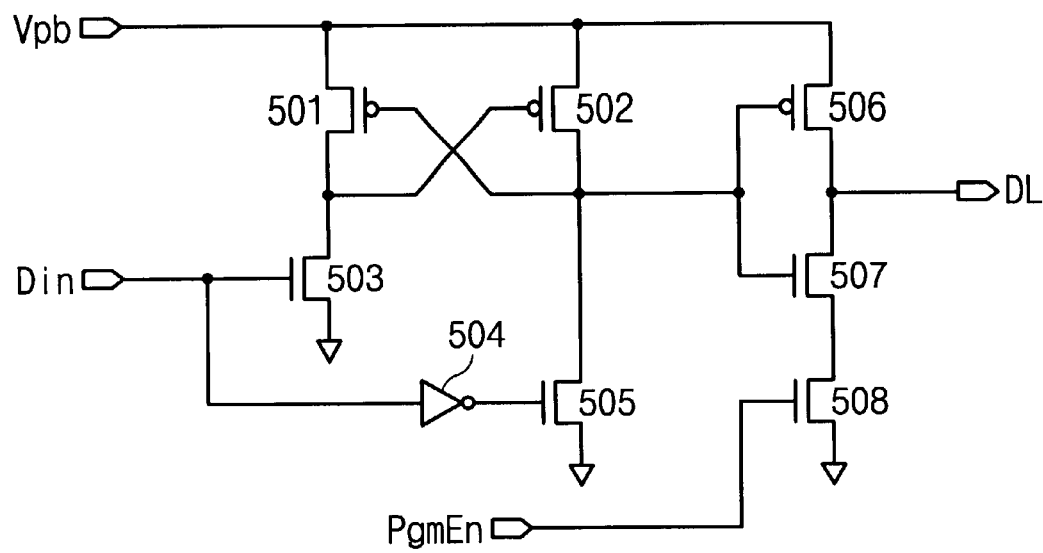
FIG. 6 is a circuit diagram showing a preferred embodiment of a write driver illustrated in FIG. 4.

FIG. 6 illustrates a preferred embodiment of a typical write driver (e.g. driver 280a) according to the present invention. A write driver 280a is made of three PMOS transistors 501, 502, and 506, four NMOS transistors 503, 505, 507, and 508, and an inverter 504. Upon circuit operation, if the value of program input data Din is "0" and a control signal PgmEn is at a high level, a voltage Vpb is applied to a data line DL through the PMOS transistor 506. If the value of Din is "1" and the control signal PgmEn is at a high level, the data line DL is grounded through the NMOS transistors 507 and 508. In other words, if the value is "1" and the control signal PgmEn is at a high level, the data line DL is electrically isolated from the voltage Vpb.

Returning to FIG. 4 again, the NOR-type flash memory device further includes a second high voltage charge pump 360, a second external voltage pad 400, and a second voltage switch circuit 420. The second high voltage charge pump 360 generates a voltage (e.g., a drain voltage) to be applied to a bitline in programming. The second external voltage pad 400 receives an external voltage that is externally received in a test operation. In a test mode, a cell current of a memory cell to be tested is measured. This will be explained in detail later. The second voltage switch circuit 420 selectively outputs voltages, supplied from the second high voltage charge pump 360 and the second external voltage pad 400, in response to select signals.

Figure 7:
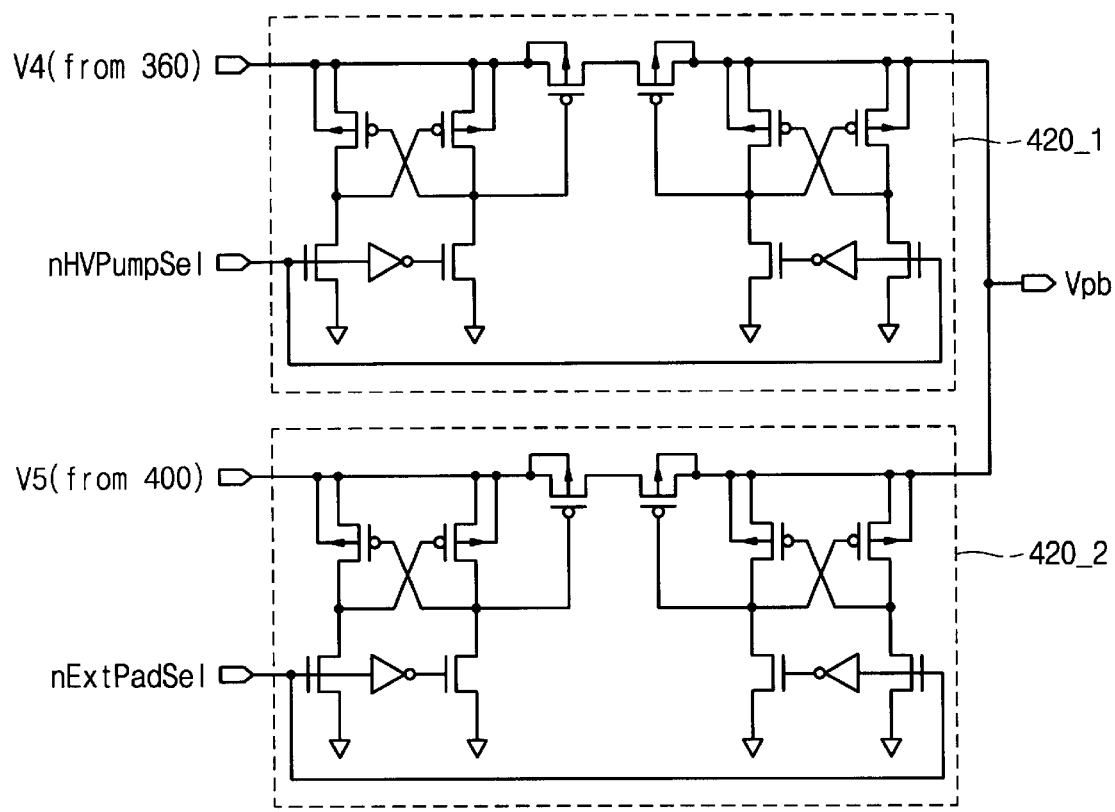
FIG. 7 is a circuit diagram showing a preferred embodiment of a second voltage switch circuit illustrated in FIG. 4.

FIG. 7 illustrates a preferred embodiment of the second voltage switch circuit 420. The second voltage switch circuit 420 is made of a first selector 420_1 and a second selector 420_2. The first selector 420_1 transfers a voltage V4, generated from a high voltage charge pump 360, to an output terminal Vpb if a select signal nHVPumpSel is at a low level. Also, the first selector 420_1 electrically isolates the high voltage charge pump 360 from the output terminal Vpb if the select signal nHVPumpSel is at a high level. The second selector 420_2 transfers a voltage V5, supplied from an external voltage pad 400, to the output terminal Vpb if a select signal nExtpadSel is at a low level. Also, the second selector 420_2 electrically isolates the external voltage pad 400 from the output terminal Vpb if the select signal nExtPadSel is at a high level.

In the foregoing NOR-type flash memory device, a cell current is measured through a second external voltage pad. Such a manner is different from a conventional manner.

Now, a cell current measuring operation will be described more fully hereinafter. In order to select a memory cell to be measured of each array block 100a, 100b, ..., and 100c, any wordline is designated by a row decoder 120. And, a bitline of each array block 100a, 100b, ..., and 100c is designated by a column decoder 220 and a corresponding column selector. An external voltage applied to a first external voltage pad 200 is supplied to the selected wordline through a first voltage switch circuit 140 and a row decoder 120. An external voltage Vpb applied to a second external voltage pad 400 is supplied commonly to write drivers 280a, 280b, ..., and 280c through a second voltage switch circuit 420. Data of "0" is applied to one of input/output pad 340a, 340b, ..., and 340c, while data of "1" is applied to the others.

In a write driver (e.g., 280a) to which the "0" data is applied through a corresponding data input buffer (e.g., 320a), an external voltage Vpb externally supplied through a second voltage switch circuit 420 is transferred to a data line DLa. That is, the external voltage Vpb is applied to a selected bitline of an array block 100a. On the other hand, in a write driver to which "1" data is applied through a corresponding input buffer, a second switch circuit 420 is electrically isolated from a corresponding data line. Therefore, a voltage of a second external voltage pad 400 is measured to determine the current flowing through a selected memory cell of the array block 100a.

The invention has been described using an exemplary preferred embodiment. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A non-volatile semiconductor memory device including an array of memory cells arranged in a matrix of a plurality of bitlines and a plurality of wordlines, wherein the bitlines are classified into a plurality of groups each corresponding to input/output pads, the device comprising:
   a column selector for selecting one of the bitlines of the respective groups;
   a first voltage switch circuit for selecting a first program voltage or a first external voltage; and
   write drivers each being coupled to the input/output pads through corresponding data input buffers,
   wherein, in a test operation mode to measure a cell current, each of the write drivers transfers or cuts off a voltage selected by the first voltage switch circuit to a selected bitline of a corresponding group in response to a data bit signal applied to a corresponding input/output pad.

2. The device as claimed in claim 1, further comprising:
   a row decoder for selecting one of the wordlines to supply a wordline voltage to the selected wordline; and
   a second voltage switch circuit for selecting one of a second program voltage, a read voltage, and a second external voltage to transfer the selected voltage as the wordline voltage to the row decoder.

3. The device as claimed in claim 2, wherein a cell current is measured through a measure pad to which the second external voltage is supplied when the voltage selected by the first voltage switch circuit is transferred to a selected bitline of a corresponding group.

4. The device as claimed in claim 2, wherein each of the write drivers transfers the voltage selected by the first voltage switch circuit to a selected bitline of a corresponding group if a value of a data bit applied to a corresponding input/output pad is "0".

5. The device as claimed in claim 2, wherein each of the write drivers cuts off transfer of the voltage selected by the first voltage switch circuit to a selected bitline of a corresponding group if a value of a data bit applied to a corresponding input/output pad is "1".

6. The device as claimed in claim 1, wherein the memory cells have a NOR-type configuration.

7. A method of measuring a non-volatile semiconductor memory device including a plurality of bitlines, a plurality of wordlines, and an array of memory cells located at intersections of the bitlines and the wordlines, wherein the bitlines are classified into groups each corresponding to input/output pads, the method comprising the steps of:

selecting one of the wordlines and one of the bitlines of the groups;

applying a first external voltage as a wordline voltage to the selected wordline;

applying a data bit signal of first voltage level to one of the input/output pads, and a data bit signal of a second voltage level to the others; and applying a second external voltage as a bitline voltage to the selected bitline through a write driver corresponding to the data bit signal of the first voltage level, in a test operation mode to measure a cell current.

8. The method as claimed in claim 7, further comprising a step of separating write drivers from the second external voltage, the write drivers each corresponding to the input/output pads to which the data bit signal of the second voltage level is applied.

9. The method as claimed in claim 8, further comprising a step of measuring a cell current of a memory cell corresponding to the data bit signal of the first voltage level through a measure pad to which the second external voltage is applied.

* * * * *